United States Patent [19]

Harris et al.

[11] Patent Number: 5,069,873

[45] Date of Patent: Dec. 3, 1991

[54] LOW CARBON DIRECTIONAL SOLIDIFICATION ALLOY

[75] Inventors: Kenneth Harris, Spring Lake; Gary L. Erickson, Muskegon, both of Mich.

[73] Assignee: Cannon-Muskegon Corporation, Muskegon, Mich.

[21] Appl. No.: 393,705

[22] Filed: Aug. 14, 1989

[51] Int. Cl.$^5$ .................. C22C 19/05; C22F 3/00
[52] U.S. Cl. .................. 420/448; 148/404; 148/410; 148/428
[58] Field of Search ............... 420/448; 148/404, 410, 148/428

[56] References Cited

U.S. PATENT DOCUMENTS 4,589,937 5/1986 Jackson et al. .................. 148/404

Primary Examiner—Melvyn J. Andrews
Assistant Examiner—Margery S. Phipps
Attorney, Agent, or Firm—Price, Heneveld, Cooper, DeWitt & Litton

[57] ABSTRACT

A nickel base superalloy for columnar grain, directional solidification which contains Re for strength and creep resistance, and substantially eliminates the use of Zr and minimizes Si to prevent DS grain boundary cracking. The creep- and stress-rupture properties, which approach nickel base superalloy single crystal performance, are achieved without the use of high temperature gamma prime solution treatment.

19 Claims, 14 Drawing Sheets 100X
 400X
 1000X
 1000X

LOW CARBON DIRECTIONAL SOLIDIFICATION ALLOY

SUMMARY OF THE INVENTION

This invention relates to a directionally solidified (DS), columnar grain, low carbon, nickel based superalloy.

BACKGROUND OF THE INVENTION

This alloy is designed to provide a high creep strength material capable of sustained operation at very high temperature, high stress conditions. It has been developed to provide a directionally solidified (DS), columnar grain alloy which imparts component creep performance and environmental properties (oxidation and hot corrosion resistance) similar to that of the first generation single crystal alloys. The alloy is designed for turbine engine airfoil components, the design of which makes them very difficult to be cast, or at best, impractical to cast using single crystal technology. The size and shape of some components, particularly turbine vane segments and the long, low pressure (LP) turbine blades now being designed for advanced technology, high performance engines are not currently capable of being cast, using current single crystal technology. Therefore, it has become very important to develop a DS alloy having characteristics approaching those of the first generation single crystal alloys to allow for further turbine engine performance improvements.

The new, more powerful, large, aircraft turbofan engines have increased diameter, and thus, increased length of the turbine blades. The LP turbine blade length ($\geq 8''$) required of certain advanced design turbofan engines is such that they cannot readily be cast as a single crystal. Such blades encounter an unacceptable loss of thermal gradient during the single crystal casting operation and the resulting castings begin to exhibit serious grain defects, such as moderate angle boundary defects which are referred to as "slivers", clusters of equiaxed grains known as "freckles", and high angle spurious grains. These grain defects particularly reduce the mechanical fatigue properties of the LP turbine blades.

A difficulty which this invention addresses is that the LP turbine blades for the new generation of very high performance aircraft turbofan engines require an alloy with creep strength in a temperature/stress environment which heretofore has necessitated the use of a single crystal superalloy. However, at the same time, the performance requirements necessitate blade designs of a configuration which cannot be readily cast using the single crystal technique. When it became evident several years ago that advanced turbine engine designs appeared likely to encounter such a barrier for lack of a suitable alloy from which to cast the new LP turbine blades of long length ($\geq 8''$), the search for a new alloy was initiated. The starting point was the high performance and proven, directional solidification, columnar grain nickel-base alloy CM 247 LC (U.S. Pat. No. 4,461,659) because it is used to successfully cast the long LP blades and exhibits microstructural stability under high temperature/stress conditions. However, this alloy did not have the strength and creep resistance necessary for use under the temperature/stress conditions created by some of the newest, advanced turbofan engine designs. CM 247 LC requires a tightly controlled chemistry such that even small variations from the narrow range of its acceptable composition can and do have marked and often unpredictable effects upon the alloy's performance characteristics. The greater the variation from the optimum chemistry the greater the adverse effect upon its performance characteristics. Therefore, the problem was how could its strength be increased to more clearly equal that of a single crystal alloy without having a serious deleterious effect upon its other desirable characteristics, such as reduction of its resistance to grain boundary cracking during the DS casting operation, and increasing the alloy's tendency to form plate-like $M_6C$ and TCP phase formation, among others. A further complication in the CM 247 LC chemistry as a base from which to work was the use of zirconium (Zr) as a creep strengthener. This presented a serious problem because whatever alloy was to be developed could not afford to lose the creep strength characteristics Zr provides in the CM 247 LC alloy, but at the same time, the tendency of Zr to migrate to and concentrate at grain boundaries could lead to serious DS castability problems.

Another problem encountered in the attempts to successfully cast as a single crystal, parts such as turbine engine vane segments, is that of the residual stresses created by the difference in both the rate and the amount of thermal contraction between the metal of the casting and that of the ceramic mold into which the metal has been poured. These stresses occur as the casting solidifies and cools. This condition can create excessive residual casting stresses. This residual stress can result in recrystallization during high temperature solution treatment of DS vane segments in alloys such as CM 247 LC. DS vane segments exhibiting recrystallization must be rejected due to the formation of undesirable transverse grain boundaries in the thin, upper or lower trailing edges of the vane airfoils. These transverse grain boundaries can nucleate thermal fatigue cracks during engine service. This situation is complicated and substantially worsened when the design of the vane segment (see FIG. 9) has significant overhang at the top and bottom shroud, which tend to hang-up in the mold and increase the stresses within the airfoils resulting from solidification and cooling. At the present time, there is no known way of effectively relieving these stresses and achieving full gamma prime ($\gamma'$) solutioning without occurrence of recrystallization.

Another important facet of this problem is that of creep. The alloy of this invention is designed for use in very high performance engines. In application, the blades must be confined as closely as possible within their surrounding turbine casing to hold to a minimum gas leakage between the blade tips and the casing. Creep becomes a very important factor in limiting the degree to which the clearance between blade tip and the casing can be closed without causing excessive contact and the danger of turbine blade damage or failure. Additionally, modern turbine engine design can require the integrally shrouded vane segments support a bearing and hence the requirement for improved creep strength DS superalloys. When single crystal technology can be used, the problem of creep is materially reduced. One of the objectives of this invention is to approach the single crystal creep strength characteristic while using the columnar grain, directional solidification casting technique.

Because the application of the advanced vane segments and the low pressure blades require use of an alloy which could produce functional characteristics quite close to those of a single crystal alloy, it was necessary to add a strengthening element to partially compensate for the shift from single crystal to directional solidification casting techniques and to compensate for the necessity to eliminate high temperature solutioning processes to strengthen the alloy. For this purpose, rhenium (Re) was added. While Re increases strength, it also is prone to creating alloy phase instability. Re, under high temperature (>1700° F. (927° C.)) stress conditions can initiate the formation of plate-like, acicular appearing, topologically close packed (TCP) phases which are rhenium and tungsten rich and which if of sufficient size and frequency may nucleate premature mechanical fatigue cracks. The tests conducted on the alloy of this invention are evidence that the alloy composition herein disclosed has been able to take advantage of rhenium strengthening characteristics without the adverse effects resulting from creating excessive, large size and extensive rhenium, tungsten rich TCP phases. This has been accomplished by utilizing a very subtle balance of chemistry.

One of the advantages of single crystal superalloys is the ability to omit such elements as B, C, Zr and Hf because their basic purpose in high strength superalloys is that of strengthening grain boundaries. Omitting these elements increases the incipient melting point of the alloy. This has the advantage of permitting full solutioning of the $\gamma'$. This makes an important contribution to the creep strength of the alloy. Some advance design vane segment castings made from DS type alloys cannot be solution treated to this extent because there is the danger of recrystallization in the casting. Consequently, their thermal fatigue strength can be adversely affected. Thus, a different approach to obtaining strength improvement was necessary which is the purpose of adding Re.

BRIEF SUMMARY OF THE INVENTION

The invention provides a directionally solidified, columnar grain, low carbon, nickel base alloy which derives its additional strength from the addition of rhenium and the substantial reduction of zirconium. The alloy is essentially stable even after exposure at sustained temperatures above 1700° F. (927° C.).

These and other advantages provided by this invention will be understood upon reading the following specification and the accompanying drawings.

DESCRIPTION OF THE INVENTION

The alloy of this invention is a rhenium containing, directionally solidified (DS) columnar grain, nickel base, superalloy which, in the as-cast and double aged condition, has creep-rupture properties between that of DS CM 247 LC "super solutioned" and double aged (U.S. Pat. No. 4,461,659) and single crystal first generation alloys such as CMSX-2 or 3 (U.S. Pat.

No.4,582,548). In developing such an improved creep strength DS alloy, it was necessary to attain, as much as possible, the high temperature creep resistance of single crystal alloys without resorting to high temperature solution treatment and while also avoiding the grain boundary cracking problems which have been experienced during DS casting of thin wall, cooled airfoils in very high strength alloys.

It has been recognized that zirconium (Zr) has a tendency to migrate to grain boundaries and, consequently, Zr containing superalloys have the characteristic of sensitivity to small changes in Zr content in relation to grain boundary strength, ductility and DS castability. However, the experimental work done in developing this alloy revealed evidence that the phenomena of grain boundary cracking during the DS casting process is extremely sensitive to minute changes in both the Zr and silicon (Si) content of the alloy ingot. Experimentation and testing revealed that reducing these two elements to low levels such as 0.017% for Zr and 0.02% for Si was a partially successful means of overcoming the DS grain boundary cracking problem. In fact, it was found to be very beneficial to further reduce these levels to 0.006% Zr and 0.007% Si. This improvement proved to be quite significant, permitting the most complex, thin wall, cooled vane segments and turbine blades to be produced by DS columnar grain casting without any occurrence of grain boundary cracking during the DS casting operation. Zr has long been used in this type of alloy to increase creep strength. It was found during the experimental work that the reduction in alloying Zr to an extremely low level (0.006%) did not reduce the creep strength but increased the DS transverse rupture ductility. The ultra low Zr nearly doubles the DS transverse (55.0 ksi/1600° F. (379 MPa/871° C.) stress-rupture ductility compared to the earlier CM work.

Figure 2:
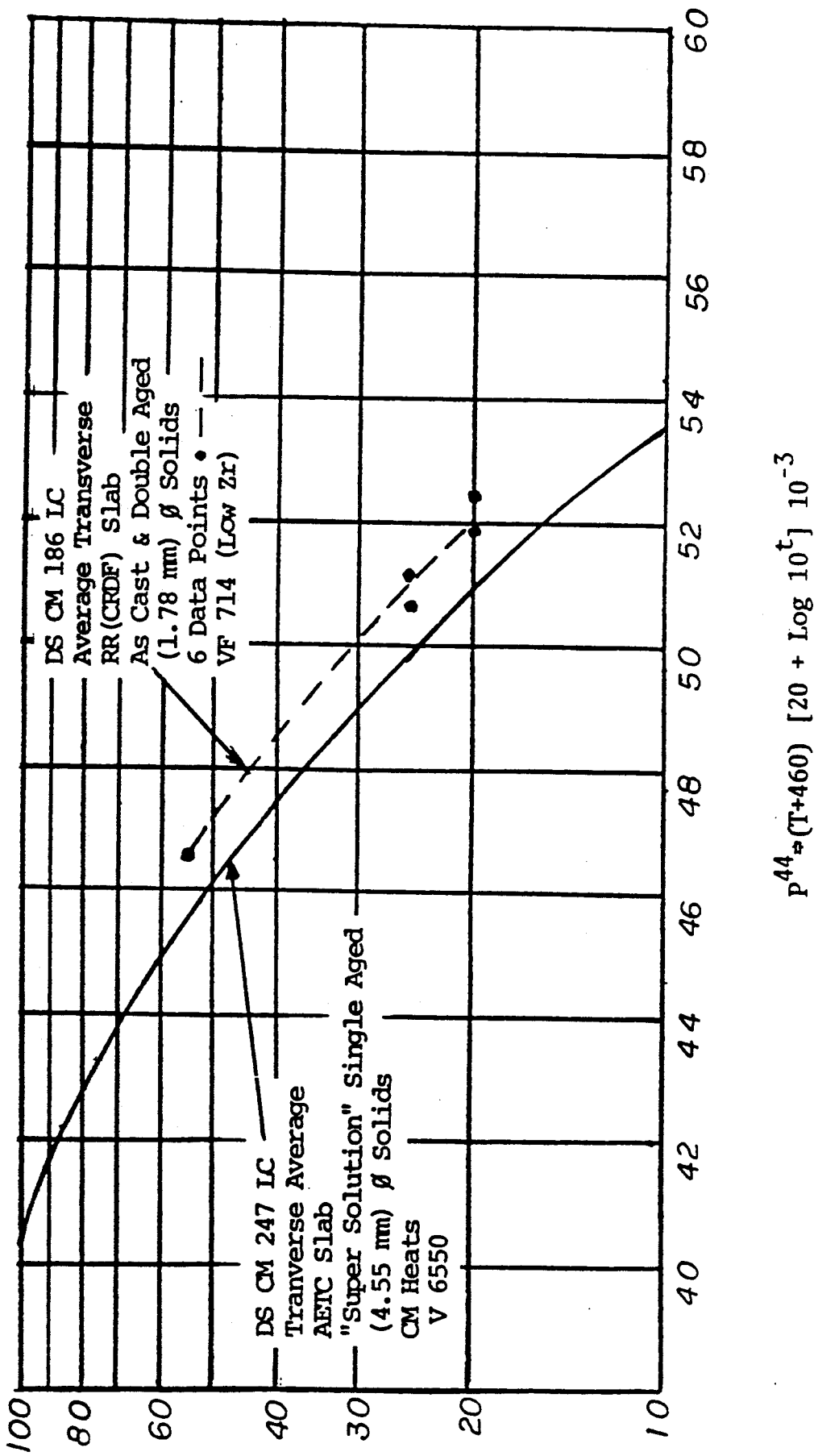
FIG. 2 shows Larson-Miller curves of stress-rupture tests, DS transverse, comparing the alloy of this invention (CM 186 LC) as-cast and double aged, with DS CM 247 LC "super solutioned" and single aged.

FIG. 2 graphically shows that VF 714 slab in the as-cast and double aged condition exhibits an appreciable increase in transverse strength over DS CM 247 LC in the "super solutioned" and single aged condition. Further, the DS transverse rupture ductility is improved as evidenced by increasing the elongation from 3.9–4.8% for a heat having 0.018% Zr to 7.3–10.6% with the super low Zr composition (0.006%) of the VF 714 heat tested at 55.0 ksi/1600° F. (379 MPa/871° C.) (Table IV). The ultra low Zr content (0.006%) of the VF 714 heat appears to have doubled the transverse stress-rupture ductility. The transverse stress-rupture characteristics of the new alloy are tabulated in Table IV.

Research suggested a reduction in chromium (Cr) and increase in the base element nickel (Ni) was desirable to minimize TCP phase formation. Optimization of tungsten (W) and Re alloy chemistry is helpful in controlling the tendency to form a possible Re-W $M_6C$ platelet phase or Re-W containing TCP phases following high temperature stress exposure.

As a result of several years of experimenting and testing, an alloy was developed having the ingot composition set out in Table I.

TABLE I

| (Wt. % or Wt. ppm) | |
| --- | --- |
| C | .05–.09 |
| Si | .02 max. |
| Mn | .02 max. |
| P | .005 max. |
| S | 12 ppm max. |
| Cr | 5.5–7.0 |
| Co | 9.0–9.5 |
| Mo | .30–.70 |
| W | 8.0–9.0 |
| Ti | .5–.9 |
| Al | 5.5–6.0 |
| Ta | 3.0–4.0 |
| Hf | 1.2–1.8 |
| B | .010–.024 |
| Zr | .004–.010 |
| Fe | .15 max. |
| Cu | .01 max. |
| Cb | .10 max. |
| Mg | 80 ppm max. |
| V | .05 max. |
| Re | 2.8–3.1 |
| [N] ppm | 10 max. |
| [O] ppm | 10 max. |
| Ni | Balance. |

Based upon this alloy specification, heat VF 714 was prepared having the specific composition set out in Table II.

TABLE II

| (Wt. % or Wt. ppm) | |
| --- | --- |
| C | .070 |
| Si | .007 |
| Mn | .003 |
| Cr | 6.6 |
| Mo | .50 |
| Fe | .11 |
| P | <.005 |
| S ppm | 3 |
| Cu | <.001 |
| Co | 9.2 |
| V | <.005 |
| Cb | <.05 |
| Ta | 3.2 |
| W | 8.5 |
| Al | 5.68 |
| Ti | .69 |
| B | .016 |
| Re | 3.0 |
| Hf | 1.40 |
| Zr | .006 |
| Mg ppm | 13 |
| [N] ppm | 2 |
| [O] ppm | 3 |
| Ni | Balance |

Specimens were machined from a slab DS cast from the VF 714 heat. The specimens were, as-cast and double aged heat treated, as described in Tables III and IV and then tested longitudinal and transverse to the grain direction for creep- and stress-rupture properties. The results of these tests are set out in Tables III and IV.

TABLE III

CM 186 LC (VF 714) (Ultra Low Zr)
DS Slab
DS Longitudinal Creep-Rupture
As-Cast + Double Aged [4 hrs/1975° F. (1080° C.) AC +
20 Hrs/1600° F. (871° C.) AC] 0.250" Dia. (6.35 mm)
Gage Solid Specimens.

| Specimen # | Test Conditions | % Plastic Strain at 20 hrs | Time (Hrs) To Creep 1.0% | Time (Hrs) To Creep 2.0% | Rupture Life Hrs | Elong. % 4D | RA % |
|---|---|---|---|---|---|---|---|
| VF714 1L | 65.27 ksi/1562° F. (450 MPa/850° C.) | 0.169 | 169.1 | 284.3 | 719.3 | 23.7 | 30.0 |
| VF714 2L | 21.76 ksi/1742° F. (150 MPa/950° C.) | 0.018 | 1300.1 | 1810.2 | 2985.9 | 40.2 | 49.2 |
| VF714 3L | 17.40 ksi/1922° F. (120 MPa/1050° C.) | 0.383 | 120.7 | 212.8 | 327.2 | 36.0 | 55.4 |

TABLE IV

CM 186 LC (VF 714) (Ultra Low Zr)
DS Slab
DS Transverse Stress-Rupture
As-Cast + Double Aged [4 Hrs/1975° F. (1080° C.) AC +
20 Hrs/1600° F. (871° C.) AC] 0.070" Dia. (1.78 mm)
Gage Solid Specimens

| Specimen # | Test Conditions | Rupture Life Hrs | Elong. % 4D | RA % |
|---|---|---|---|---|
| VF714 B1T | 55.0 ksi/1600° F. (379 MPa/871° C.) | 413.2 | 10.6 | 19.6 |
| VF714 T4T | 55.0 ksi/1600° F.) (379 MPa/871° C.) | 417.6 | 7.3 | 11.7 |
| VF714 B2T | 25.0 ksi/1800° F. (172 MPa/982° C.) | 442.0 | 8.3 | 20.4 |
| VF714 T5T | 25.0 ksi/1800° F. (172 MPa/982° C.) | 258.9 | 8.8 | 15.7 |
| VF714 B3T | 20.0 ksi/1900° F. (138 MPa/1038° C.) | 161.5 | 13.9 | 20.6 |
| VF714 T6T | 20.0 ksi/1900° F. (138 MPa/1038° C.) | 96.8 | 11.2 | 18.9 |

Figure 1:
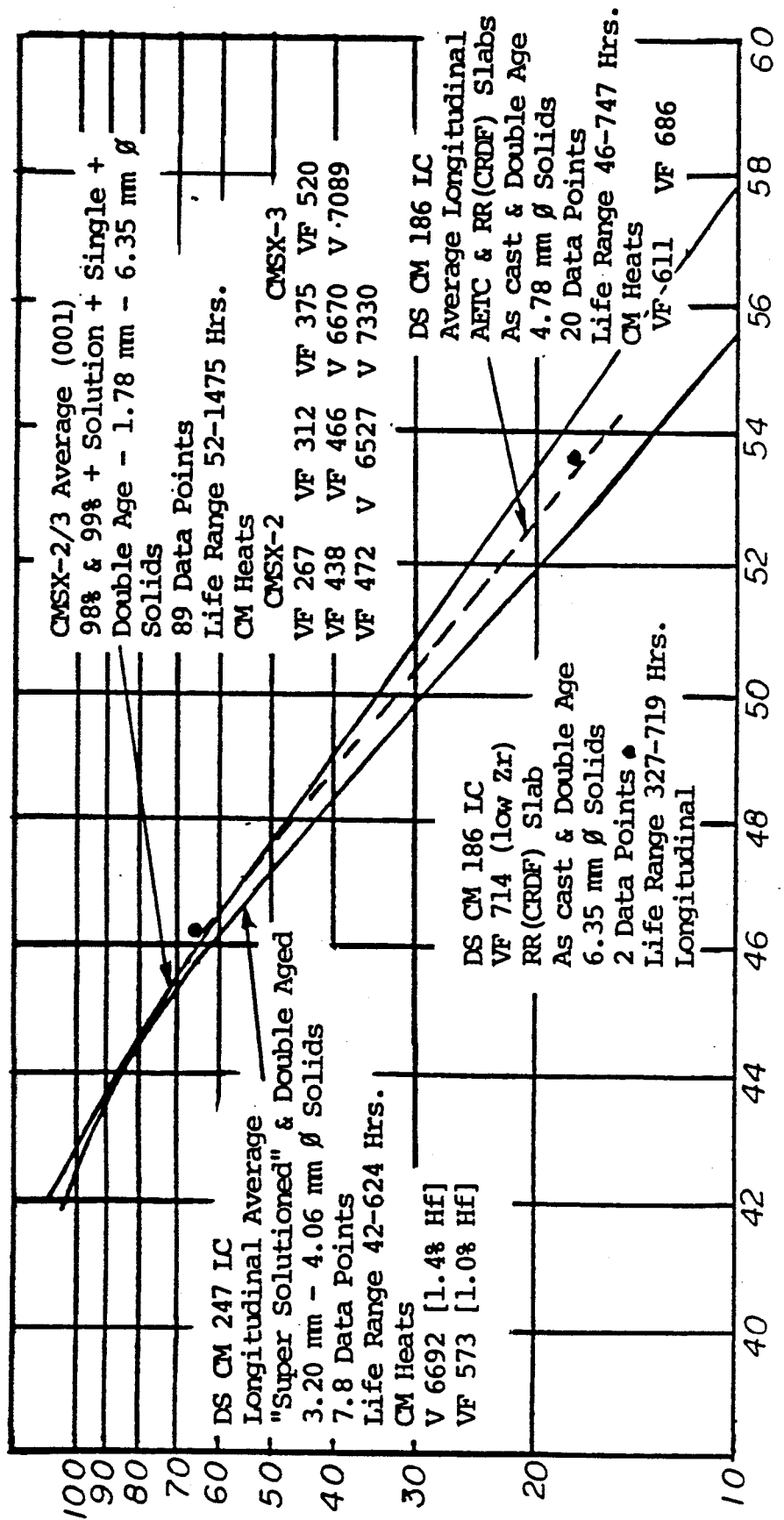
FIG. 1 shows Larson-Miller curves of stress-rupture tests of DS longitudinal as-cast and double aged specimens comparing the alloy of this invention (CM 186 LC) with DS CM 247 LC "super solutioned" and double aged and CMSX-2/3 first generation single crystal nickel-base alloys.
Figure 3:
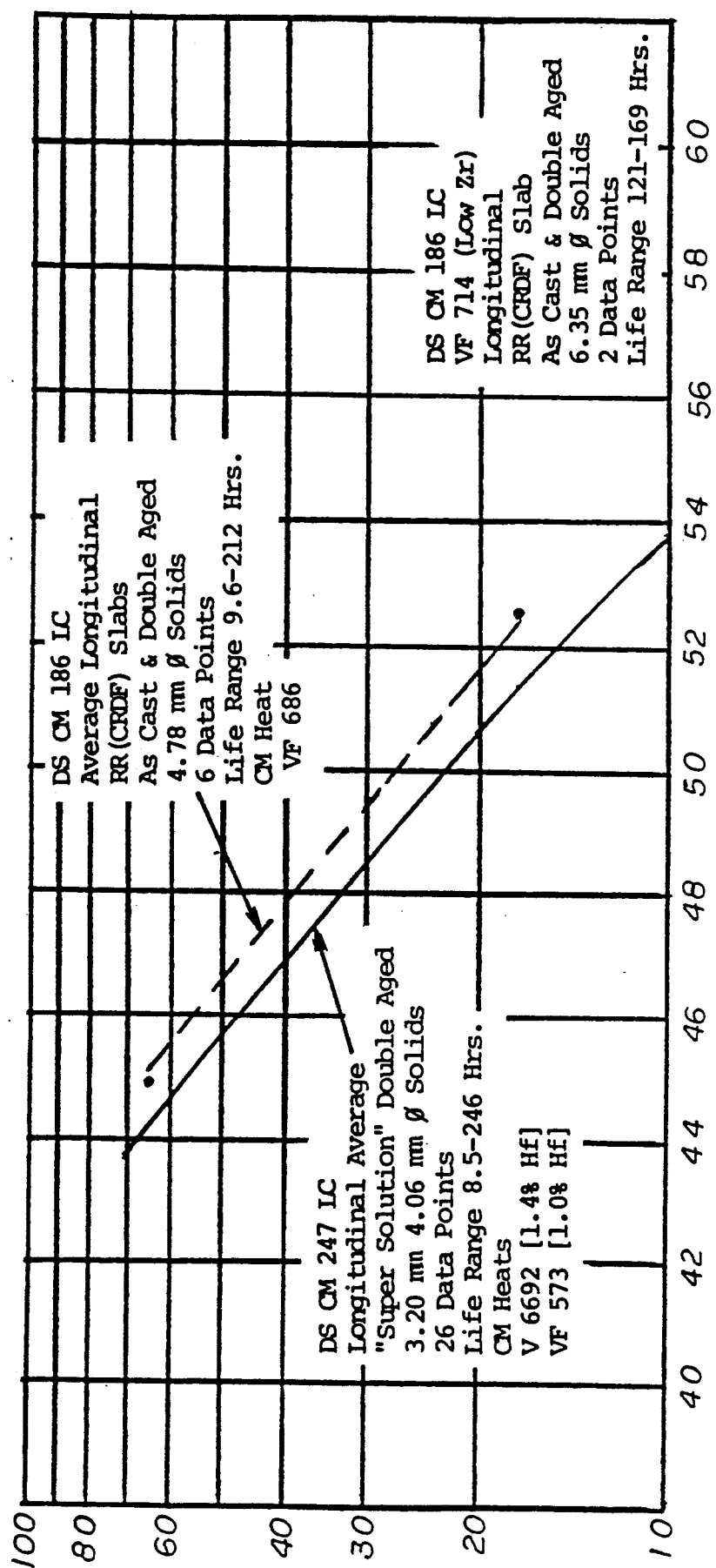
FIG. 3 shows Larson-Miller curves of DS longitudinal, stress to one percent creep, comparing the alloy of this invention (CM 186 LC) as-cast and double aged, with DS CM 247 LC "super solutioned" and double aged.
Figure 4A:
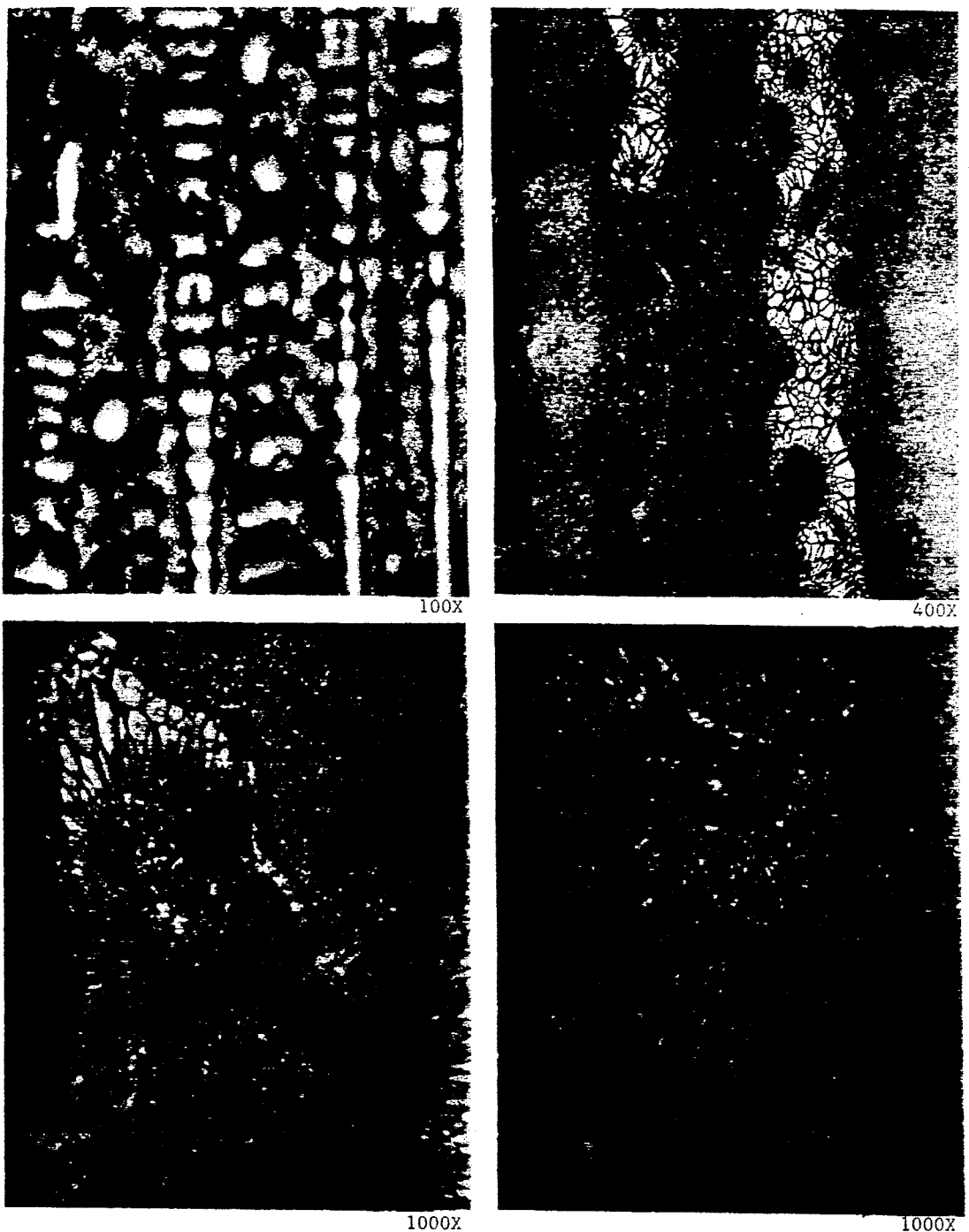
FIG. 4A is a group of optical photomicrographs taken away from the fracture of the post-test bar (6.35 mm dia.) of the alloy of this invention stressed longitudinally to the grain direction, which failed from creep-rupture at 65.27 ksi/1562° F. (450 MPa/850° C.) after 719.3 hours.
Figure 4B:
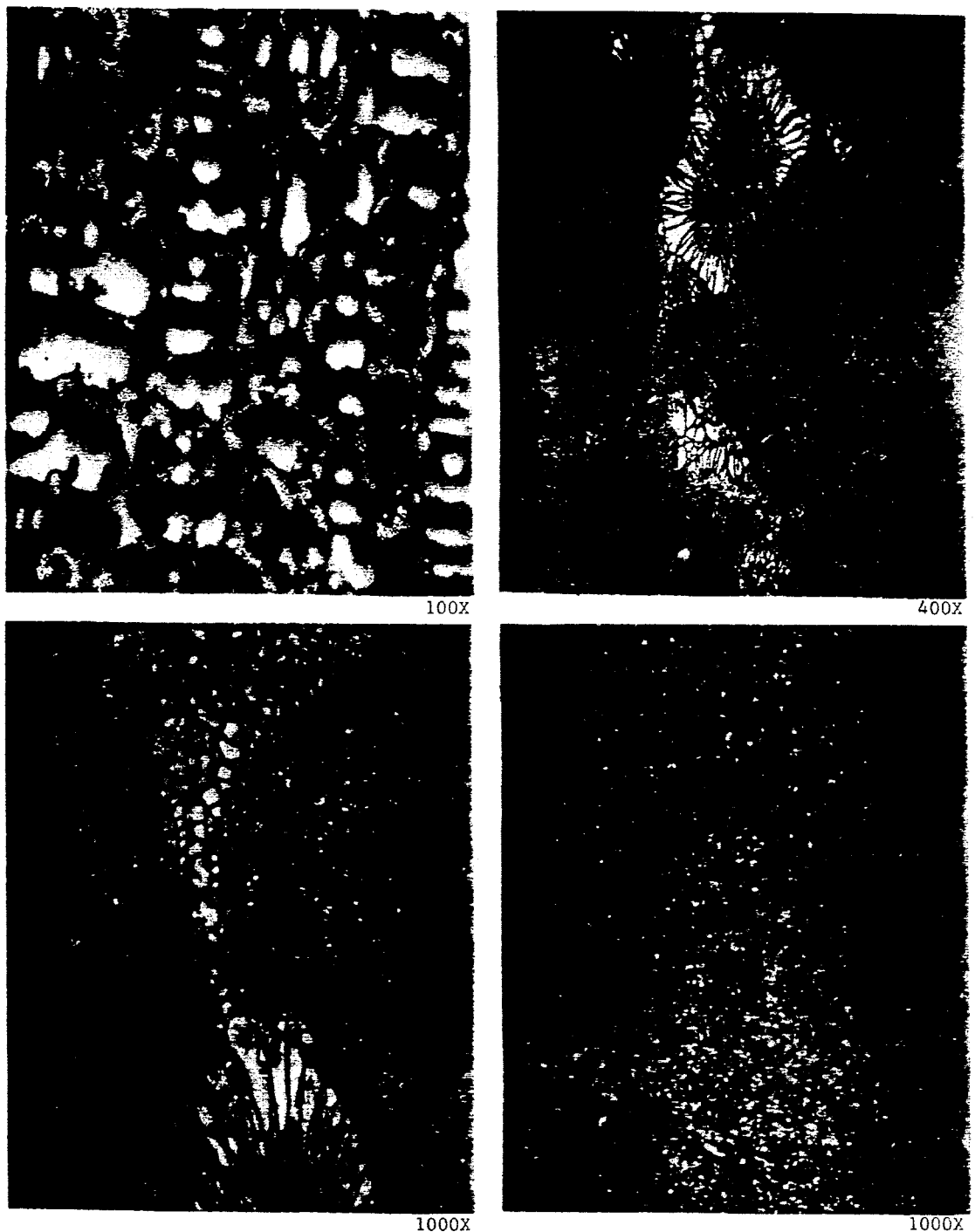
FIG. 4B is a group of optical photomicrographs taken close to the fracture of the post-test bar (6.35 mm dia.) of the alloy of this invention stressed longitudinally to the grain direction, which failed from creep-rupture at 65.27 ksi/1562° F. (450 MPa/850° C.) after 719.3 hours.
Figure 5A:
FIG. 5A is a group of optical photomicrographs taken away from the fracture of the post-test bar (6.35 mm dia.) of the alloy of this invention stressed longitudinally to the grain direction, which failed from creep-rupture at 17.40 ksi/1922° F. (120 MPa/1050° C.) after 327.2 hours.
Figure 5A:
Figure 5A:
Figure 5A:
Figure 5B:
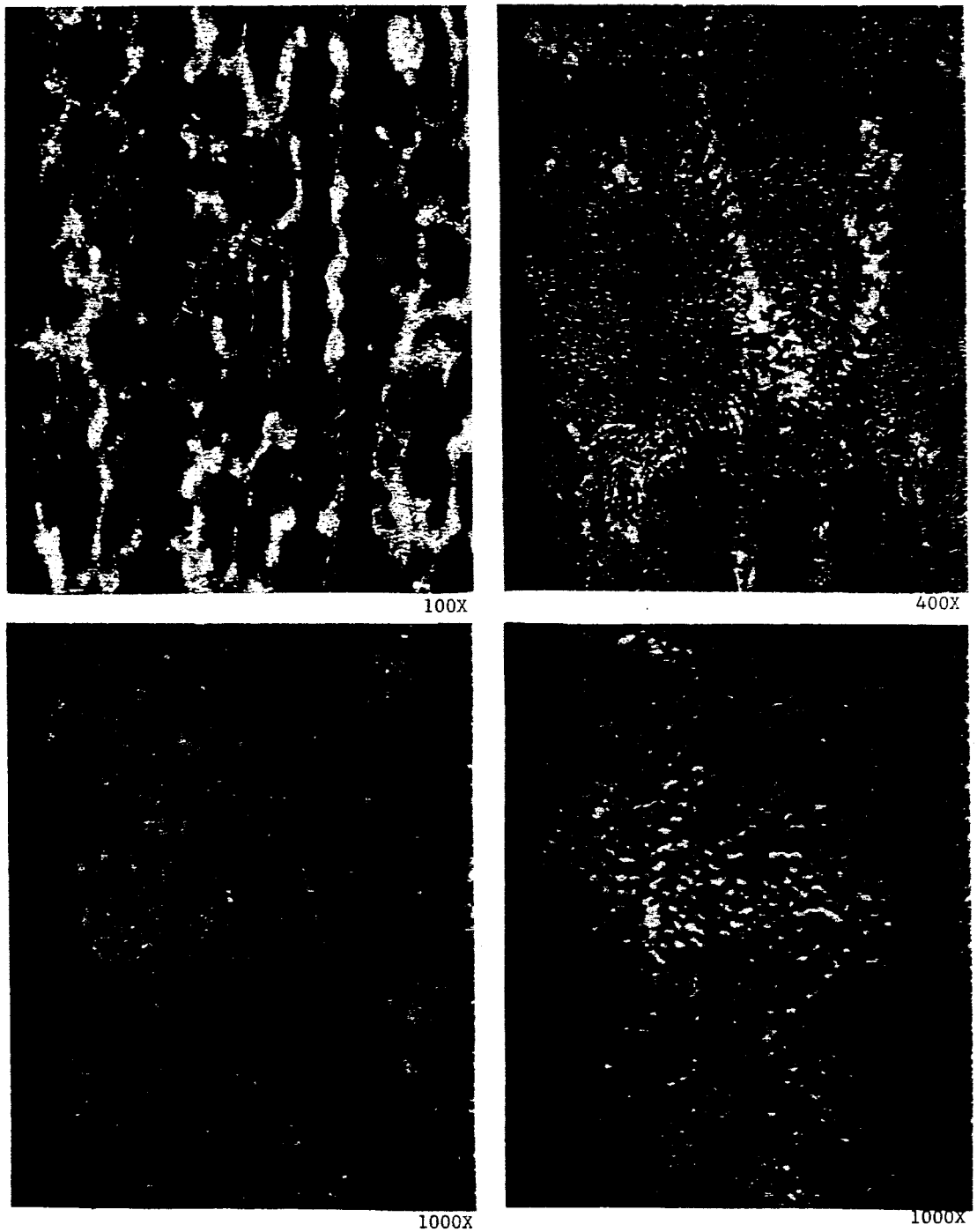
FIG. 5B is a group of optical photomicrographs taken close to the fracture of the post-test bar (6.35 mm dia.) of the alloy of this invention stressed longitudinally to the grain direction, which failed from creep-rupture at 17.40 ksi/1922° F. (120 MPa/1050° C.) after 327.2 hours.
Figure 6A:
FIG. 6A is a group of optical photomicrographs taken away from the fracture of the post-test bar (6.35 mm dia.) of the alloy of this invention stressed longitudinally to the grain direction, which failed from creep-rupture at 21.76 ksi/1742° F. (150 MPa/950° C.) after 2985.9 hours.
Figure 6A:
Figure 6A:
Figure 6A:
Figure 6B:
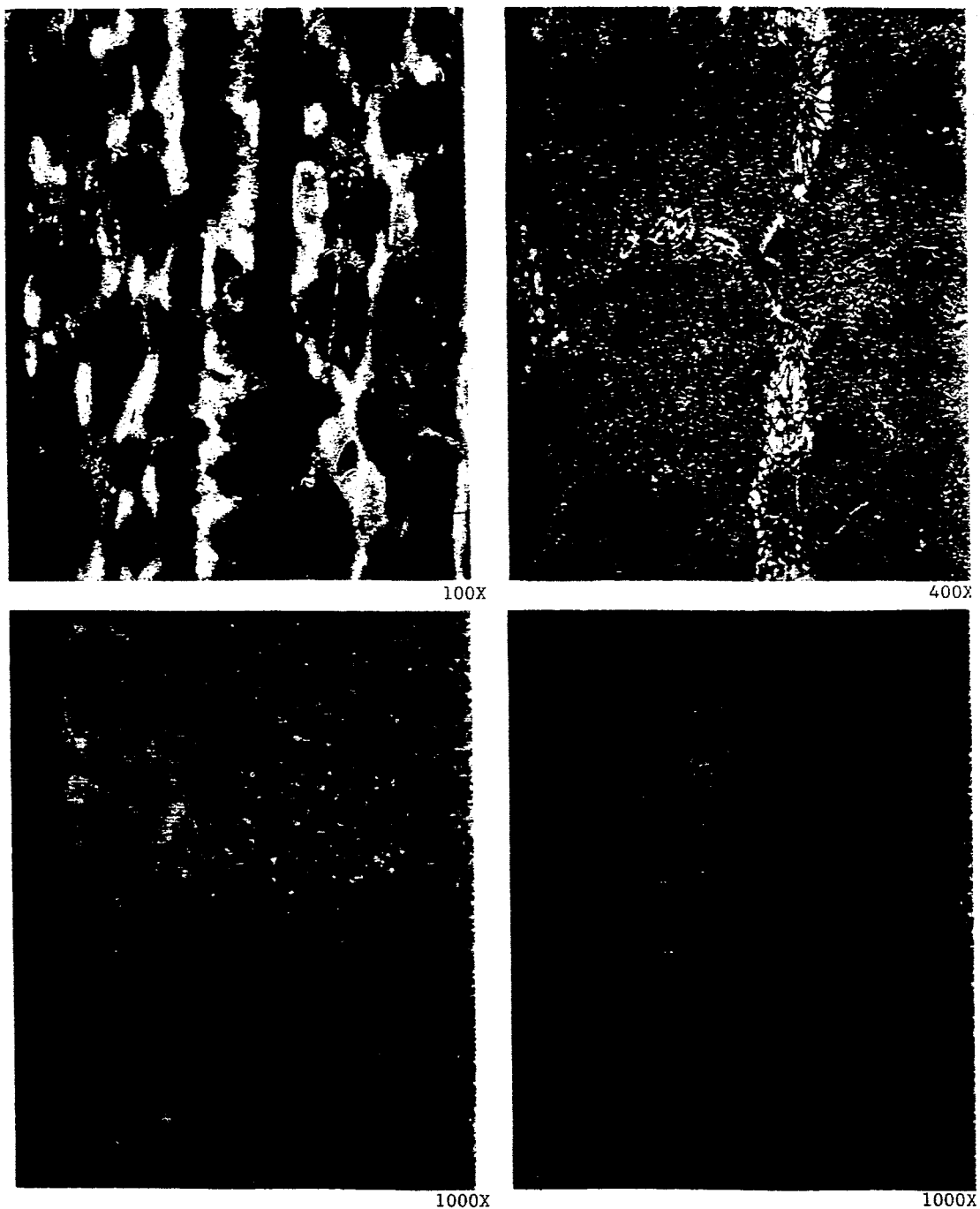
FIG. 6B is a group of optical photomicrographs taken close to the fracture of the post-test bar (6.35 mm dia.) of the alloy of this invention stressed longitudinally to the grain direction, which failed from creep-rupture at 21.76 ksi/1742° F. (150 MPa/950° C.) after 2985.9 hours.
Figure 7A:
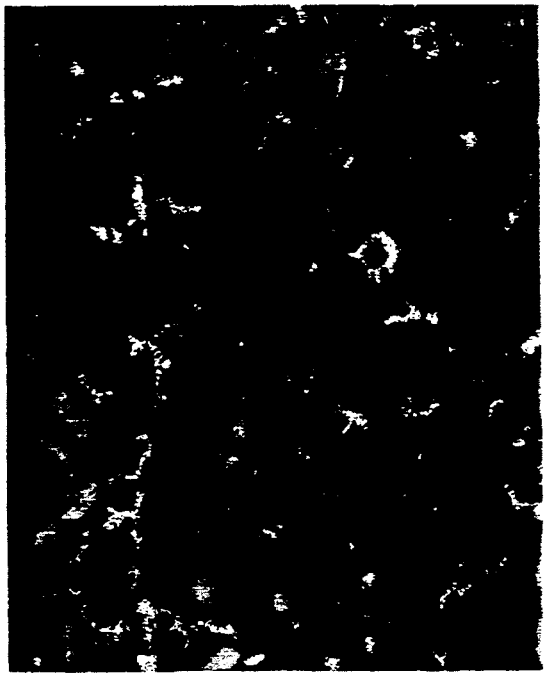
FIG. 7A is a group of optical photomicrographs taken away from the fracture of the post-test bar (1.78 mm dia.) of the alloy of this invention stressed transversely to the grain direction, which failed from stress-rupture at 25.0 ksi/1800° F. (172 MPa/982° C.) after 442.0 hours.
Figure 7A:
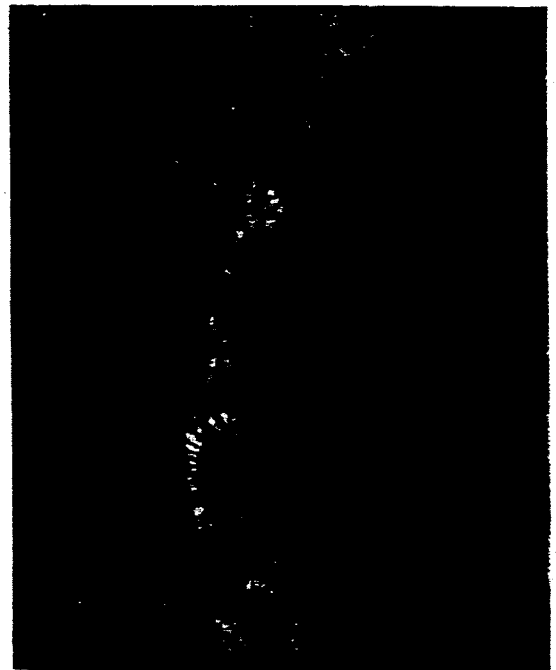
Figure 7A:
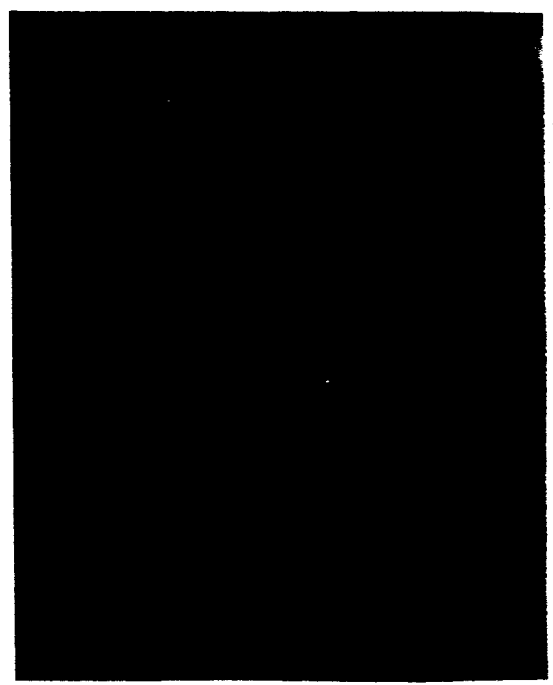
Figure 7A:
Figure 7B:
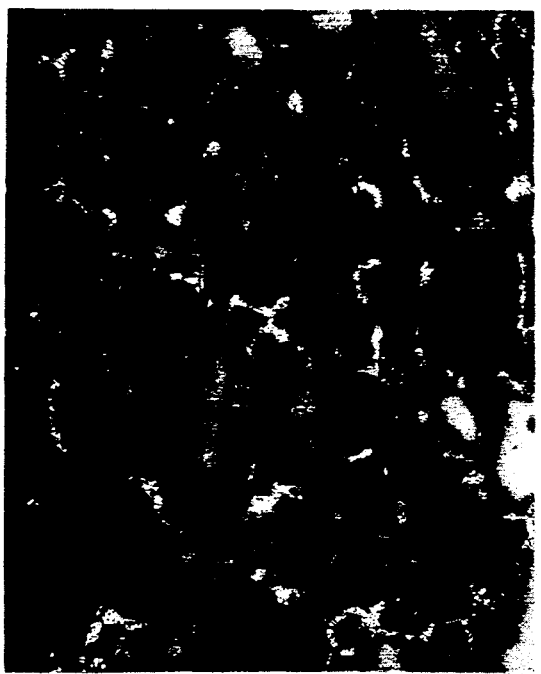
FIG. 7B is a group of optical photomicrographs taken close to the fracture of the post-test bar (1.78 mm dia.) of the alloy of this invention stressed transversely to the grain direction, which failed from stress-rupture at 25.0 ksi/1800° F. (172 MPa/982° C.) after 442.0 hours.
Figure 7B:
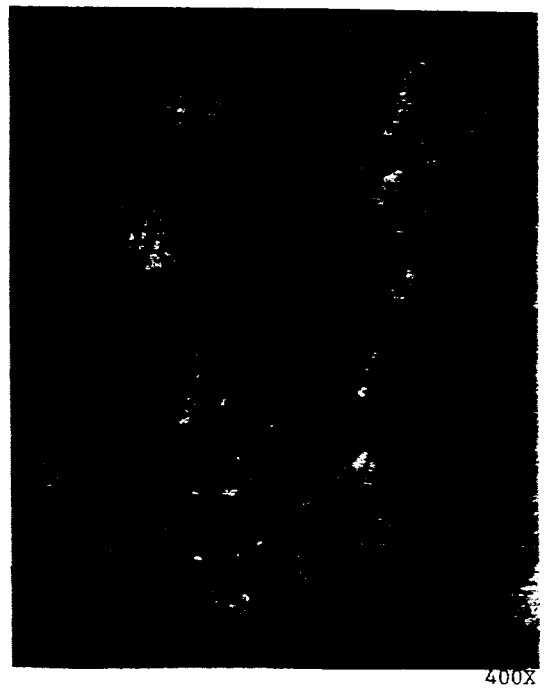
Figure 7B:
Figure 7B:
Figure 8A:
FIG. 8A is a group of optical photomicrographs taken away from the fracture of the post-test bar (1.78 mm dia.) of the alloy of this invention stressed transversely to the grain direction, which failed from stress-rupture at 20 ksi/1900° F. (138 MPa/1038° C.) after 161.5 hours.
Figure 8A:
Figure 8A:
Figure 8A:
Figure 8B:
FIG. 8B is a group of optical photomicrographs taken close to the fracture of the post-test bar (1.78 mm dia.) of the alloy of this invention stressed transversely to the grain direction, which failed from stress-rupture at 20 ksi/1900° F. (138 MPa/1038° C.) after 161.5 hours.
Figure 8B:
Figure 8B:
Figure 8B:

The results of these tests are graphically summarized in the Larson-Miller curves in FIGS. 1, 2 and 3. The results in FIG. 1 graphically compare the alloys DS CM 247 LC and CMSX-2/3 and the alloy of this invention DS CM 186 LC. The graphical data of FIGS. 2 and 3 compare DS CM 247 LC and the alloy of this invention. The data point in FIG. 2 at approximately 35 ksi/P=46.6 is a dual plot because of the identical values for two of the points. No 35 comparison is made in FIGS. 2 and 3 with CMSX-2 or 3 alloys because no comparative data is available. All three graphs show a marked improvement in the functional characteristics of creep- and stress-rupture properties of DS CM 186 LC as-cast and double aged over DS CM 247 LC, which was in the "super solutioned" and double or single aged condition. The results graphically set out in FIG. 1 make it clear that this alloy is a marked improvement over DS CM 247 LC without having to resort to the creep strengthening high temperature solution treatment and provides an alloy having functional qualities that are closer to the single crystal alloys.

A very severe creep-rupture test was conducted on a slab from the VF 714 heat in the as-cast and double aged condition. This test continued at 21.76 ksi/1742° F. (150 MPa/950° C.) for 2985.9 hours before rupture. This result was not plotted on the Larson-Miller curve (FIG. 1) because no even remotely comparable data for DS CM 247 LC or for CMSX-2/3 in terms of hours of life under this type of stress/temperature conditions is available.

A limited number of both IP (intermediate pressure) turbine blades and HP (high pressure) turbine blades have been DS cast from heat VF 714, using production process procedures. The IP blades were cast to determine any core to metal reaction problems and none was found. The HP cored turbine blades were cast root-down and convex-out, since the convex-out attitude of this component has a history of being prone to DS grain boundary cracking and is, therefore, a stiff test for an alloy's DS castability. No DS grain boundary cracking problems were encountered with heat VF 714.

Two IP and two HP blades were extensively sectioned to a turbine engine company specification cut-up plan and examined for levels of microporosity using a Quantimet 720 image analyzer. The blade porosity generally satisfied the <0.5% background figure and the isolated field criteria. Also, no continuous grain boundary carbide or gamma/gamma prime eutectic networks were apparent.

DS grain boundary cracking problems were encountered during casting an advanced, complex vane segment with an earlier version of the CM 186 LC alloy using CM heat VF 686 (0.02% Zr and 0.02% Si). CM heat VF 714 with ultra low Zr and Si contents (0.006% Zr and 0.007% Si) was successful in overcoming the DS grain boundary cracking problem inherent with the earlier heat VF 686, when DS cast into the advanced, complex vane segment. This component represents an extremely severe DS castability test for any high strength cast superalloy.

Figure 9:
FIG. 9 is a photograph of a complex, cooled, multi-airfoil vane segment cast by columnar grain, directional solidification from the alloy of this invention.

It will be recognized that this invention provides an improved creep- and stress-rupture strength DS alloy that is usable under at least two different casting and application circumstances for which no heretofore known alloy has been eminently suitable. It provides an alloy capable of sustained use as LP turbine blades designed for high temperature/high stress environments. These blades for large turbofan engines have to be of a length such that present single crystal technology is not capable of or practical for producing. It also provides an alloy for use in turbine vane segments designed for use in high temperature/high stress environments in which the necessary shape of the vane segment, such as that illustrated in FIG. 9, makes use of a single crystal casting and full gamma prime solution treatment impossible, without occurrence of deleterious casting grain defects and recrystallization.

This alloy's composition indicates it would be tolerant to the addition of very small amounts of one of the rare earth elements including yttrium (Y), lanthanum (La) or cerium (Ce). This addition would be in a very restricted range of 0.2% or less of the combined total of these elements in the ingot. This total can consist of only one of these elements or it can consist of two or three of these elements. Since these are very reactive elements, the alloy as DS cast into a finished component would probably contain only about 100 to 150 ppm of the rare earth element. However, these elements are highly effective in improving bare oxidation performance and even this small amount has a marked beneficial effect on bare oxidation resistance. Further, since this alloy contains appreciable hafnium (Hf) which is a known "protector" of rare earth elements and the DS casting temperature of this alloy is substantially less than that of single crystal alloys, there will be less reaction between the rare earth elements and the ceramics of the mold or core. The Hf has a propensity for forming a protective hafnium oxide film between the solidifying alloy and the mold or core ceramic materials.

The invention provides a directionally solidified alloy capable of being DS columnar grain cast under the foundry sophistication of production facilities experienced in casting aircraft turbine engine blades and vane segments with dependable and repeatable quality results. It provides an alloy capable of use in the casting of turbine blades and vanes, the operating conditions of which are beyond the temperature and stress capabilities of previously known, directionally solidified alloy such as CM 247 LC, yet the casting configuration makes the use of single crystal alloy technology either impractical or impossible. This is achieved without the resort to high temperature solution treatment for creep strengthening. Therefore, it provides a solution to a presently increasingly difficult and demanding situation. The invention addresses the further problem that, as the necessity of increased performance and efficiency of aircraft engines becomes both desirable and necessary, an increasingly serious technical barrier has been encountered between the need for complex turbine vane segments and for low pressure turbine blades of length such that there is a lack of availability of superalloys from which they can be cast. The invention provides a solution to this problem by providing an alloy capable of the high temperature performance required of these engines yet capable of being DS cast and used in the as-cast and double aged condition.

Recently acquired data from the continuing testing and evaluation of the alloy of this invention with ultra low Zr indicates excellent DS transverse stress-rupture properties such that the alloy is expected to demonstrate improved equiazed stress- and creep-rupture properties over the CM 247 LC alloy. Thus, it is expected to have use in conventionally cast products such as integral turbine wheel or turbocharger rotors in small gas turbines and high performance piston or rotary engine where the use involves high stress and temperature conditions.

Having described the chemistry of the new alloy and its novel functional characteristics and the problems it addresses and solves the new generation of larger and more complex, high performance aircraft turbofan LP turbine blades and HP and IP vane segments, it is submitted that Applicant is entitled to protection for both the alloy and turbine blades and vane segments casts therefrom. It is also envisaged that the alloy may find DS turbine blade applications in large industrial gas turbines using clean fuels such as natural gas. The blade lengths in these large industrial turbines can range 12" to 24" long.

We claim:

1. A conventionally cast equiaxed grain, polycrystalline, integral turbine wheel or turbocharger rotor casting for use under high stress, high temperature conditions in small gas turbines and high performance piston and rotary engines, consisting essentially of (in ppm where indicated, otherwise in wt. %):

| | |
|---|---|
| C | .05–.09 |
| Si | .02 max |
| Mn | .02 max |
| P | .005 max |
| S | 12 ppm max. |
| Cr | 5.5–7.0 |
| Co | 9.0–9.5 |
| Mo | .30–.70 |
| W | 8.0–9.0 |
| Ti | .5–.9 |
| Al | 5.5–6.0 |
| Ta | 3.0–4.0 |
| Hf | 1.2–1.8 |
| B | .010–.024 |
| Zr | .004–.010 |
| Fe | .15 max. |
| Cu | .01 max. |
| Cb | .10 max. |
| Mg | 80 ppm max. |
| V | .05 max. |
| Re | 2.8–3.1 |
| N | 10 ppm max. |
| O | 10 ppm max. |
| Ni | Balance |

2. A directionally solidified, columnar grain casting of a low carbon nickel base alloy consisting essentially of the following elements (in ppm where indicated, otherwise in wt %):

| | |
|---|---|
| C | .05–.09 |
| Si | .02 max. |
| Mn | .02 max. |
| P | .005 max. |
| S | 12 ppm max. |
| Cr | 5.5–7.0 |
| Co | 9.0–9.5 |
| Mo | .30–.70 |
| W | 8.0–9.0 |
| Ti | .5–.9 |
| Al | 5.5–6.0 |
| Ta | 3.0–4.0 |
| Hf | 1.2–1.8 |
| B | .010–.024 |
| Zr | .004–.010 |
| Fe | .15 max. |
| Cu | .01 max. |
| Cb | .10 max. |
| Mg | 80 ppm max. |
| V | .05 max. |
| Re | 2.8–3.1 |
| N | 10 ppm max. |
| O | 10 ppm max. |
| Ni | Balance |

3. A directionally solidified airfoil with a columnar grain structure cast from the nickel base alloy of claim 2 which airfoil following aging for four hours at 1975° F. then directly air cooled and then for twenty hours at 1600° F. then directly air cooled being subjected to a stress-rupture test of 21.76 ksi at 1742° F. applied longitudinally typically required 1300 hours to exhibit 1.0% creep, had a rupture life of 2985 hours with a test specimen reduction in area of 49.2% at time of rupture and an elongation of 40.2% in a 4D gage length.

4. A directionally solidified airfoil with a columnar grain structure cast from the nickel base alloy of claim 2, which airfoil following aging for four hours at 1975°

F. and then directly gas cooled and then for twenty hours at 1600° F. then directly gas cooled, being subjected to a stress-rupture test of 55.0 ksi at 1600° F. applied transverse to the grain boundaries, typically had a rupture life of 415 hours with a est specimen reduction in area of 15.7% at time of rupture and elongation of 8.9% in a 4D gage length.

5. A directionally solidified, columnar, grain casting of a low carbon nickel base alloy containing from 0 to 0.2% total by weight one or more of the elements selected from the group consisting of Y, La and Ce, which alloy in addition thereto consists essentially of the following elements (in ppm where indicated, otherwise in wt %):

| | |
|---|---|
| C | .05–.09 |
| Si | .02 max. |
| Mn | .02 max. |
| P | .005 max |
| S | 12 ppm max |
| Cr | 5.5–7.0 |
| Co | 9.0–9.5 |
| Mo | .30–.70 |
| W | 8.0–9.0 |
| Ti | .5–.9 |
| Al | 5.5–6.0 |
| Ta | 3.0–4.0 |
| Hf | 1.2–1.8 |
| B | .010–.024 |
| Zr | .004–.010 |
| Fe | .15 max. |
| Cu | .01 max. |
| Cb | .10 max. |
| Mg | 80 ppm max. |
| V | .05 max. |
| Re | 2.8–3.1 |
| N | 10 ppm max. |
| O | 10 ppm max. |
| Ni | Balance |

6. A directionally solidified airfoil casting with a columnar grain structure cast from the nickel base alloy recited in claim 2 which airfoil casting following double aging for four hours at 1975° F. then directly gas cooled and then for twenty hours at 1600° F. then directly gas cooled upon being subjected to a stress-rupture test of 21.76 ksi at 1742° F. applied longitudinally typically required 1300 hours to exhibit 1.0% creep, had a typical rupture life of 2985 hours with a test specimen typical reduction in area of 49% at time of rupture and a typical elongation of 40% in a 4D gage length.

7. A vacuum cast directionally solidified, columnar grain casting for use under high stress and high temperature, characterized by a configuration which cannot be practically cast as a substantially grain defect free single crystal, cast from the alloy consisting essentially of the following elements (in ppm where indicated, otherwise in wt %):

| | |
|---|---|
| C | .05–.09 |
| Si | .02 max. |
| Mn | .02 max. |
| P | .005 max. |
| S | 12 ppm max. |
| Cr | 5.5–7.0 |
| Co | 9.0–9.5 |
| Mo | .30–.70 |
| W | 8.0–9.0 |
| Ti | .5–.9 |
| Al | 5.5–6.0 |
| Ta | 3.0–4.0 |
| Hf | 1.2–1.8 |
| B | .010–.024 |
| Zr | .004–.010 |
| Fe | .15 max. |
| Cu | .01 max. |
| Cb | .10 max. |
| Mg | 80 ppm max. |
| V | .05 max. |
| Re | 2.8–3.1 |
| N | 10 ppm max. |
| O | 10 ppm max. |
| Ni | Balance |

8. A vacuum cast directionally solidified, columnar grain casting for use under high stress and high temperature, characterized by a configuration which cannot be practically cast as a substantially grain defect free single crystal, cast from the alloy consisting essentially of the following elements (in ppm where indicated, otherwise in wt %):

| | |
|---|---|
| C | .070 |
| Si | .007 |
| Mn | .003 |
| Cr | 6.6 |
| Mo | .50 |
| Fe | .11 |
| P | <.005 |
| S | 3 ppm |
| Cu | <.001 |
| Co | 9.2 |
| V | <.005 |
| Cb | <.05 |
| Ta | 3.2 |
| W | 8.5 |
| Al | 5.68 |
| Ti | .69 |
| B | .016 |
| Re | 3.0 |
| Hf | 1.40 |
| Zr | .006 |
| Mg | 13 ppm |
| N | 2 ppm |
| O | 3 ppm |
| Ni | Balance |

9. A vacuum cast directionally solidified, columnar grain casting as described in claim 8 for use as a turbine blade or vane wherein the configuration of the blade or vane will create stresses within the casting due to mold configuration generating constraint during solidification and cooling contraction, which stresses are of a magnitude that can subsequently nucleate recrystallization during high temperature solution treatment, unless the blade or vane is used in the as-cast and double aged condition without recourse to high temperature solution treatment.

10. The vacuum cast directionally solidified, columnar grain casting described in claim 4 for use as a turbine blade or vane wherein the length of the blade or vane is such that grain boundary defects would be caused to occur in single crystal components due to loss of thermal gradient during single crystal casting.

11. A vacuum cast directionally solidified casting as described in claim 8 for use as a turbine blade or vane wherein the configuration of the blade or vane will create stresses within the casting due to mold configuration generated constraint against contraction resulting from solidification and cooling, which stresses are of a magnitude that can subsequently nucleate recrystallization unless the blade or vane is cast as a directionally solidified, columnar grain casting and is used without recourse to high temperature solution treatment.

12. A vacuum cast directionally solidified, columnar grain casting for use under high stress and high temperature, characterized by a configuration which cannot be practically cast as a substantially grain defect free single crystal, cast from the alloy containing from 0 to 0.2% total by weight one or more of the elements selected from the group consisting of Y, La and Ce which alloy in addition thereto consists essentially of the following elements (in ppm where indicated, otherwise in wt %):

| | |
|---|---|
| C | .070 |
| Si | .007 |
| Mn | .003 |
| Cr | 6.6 |
| Mo | .50 |
| Fe | .11 |
| P | <.005 |
| S | 3 ppm |
| Cu | <.001 |
| Co | 9.2 |
| V | <.005 |
| Cb | <.05 |
| Ta | 3.2 |
| W | 8.5 |
| Al | 5.68 |
| Ti | .69 |
| B | .016 |
| Re | 3.0 |
| Hf | 1.40 |
| Zr | .006 |
| Mg | 13 ppm |
| N | 2 ppm |
| O | 3 ppm |
| Ni | Balance |

13. A columnar grain turbine blade or vane made for use under high stress, high temperature conditions, vacuum cast and directionally solidified from the alloy consisting essentially of the following elements (in ppm where indicated, otherwise in wt %):

| | |
|---|---|
| C | .05–.09 |
| Si | .02 max. |
| Mn | .02 max. |
| P | .005 max. |
| S | 12 ppm max. |
| Cr | 5.5–7.0 |
| Co | 9.0–9.5 |
| Mo | .30–.70 |
| W | 8.0–9.0 |
| Ti | .5–.9 |
| Al | 5.5–6.0 |
| Ta | 3.0–4.0 |
| Hf | 1.2–1.8 |
| B | .010–.024 |
| Zr | .004–.010 |
| Fe | .15 max. |
| Cu | .01 max. |
| Cb | .10 max. |
| Mg | 80 ppm max. |
| V | .05 max. |
| Re | 2.8–3.1 |
| N | 10 ppm max. |
| O | 10 ppm max. |
| Ni | Balance |

14. An alloy having high temperature creep resistance for use in directionally solidified, columnar grain turbine blades which have a configuration such that they cannot be cast without excessive residual internal stresses, which result in airfoil recrystallization during high temperature solution treatment, said alloy consisting of the following elements (in ppm wherein indicated, otherwise in wt %):

| | |
|---|---|
| C | .05–.09 |
| Si | .02 max. |
| Mn | .02 max. |
| P | .005 max. |
| S | 12 ppm max. |
| Cr | 5.5–7.0 |
| Co | 9.0–9.5 |
| Mo | .30–.70 |
| W | 8.0–9.0 |
| Ti | .5–.9 |
| Al | 5.5–6.0 |
| Ta | 3.0–4.0 |
| Hf | 1.2–1.8 |
| B | .010–.024 |
| Zr | .004–.010 |
| Fe | .15 max. |
| Cu | .01 max. |
| Cb | .10 max. |
| Mg | 80 ppm max. |
| V | .05 max. |
| Re | 2.8–3.1 |
| N | 10 ppm max. |
| O | 10 ppm max. |
| Ni | Balance |

15. An alloy having high temperature creep resistance for use in the directionally solidified, columnar grain casting of turbine vanes which have a configuration such that they cannot be cast without excessive residual internal stresses, which result in airfoil recrystallization during high temperature solution treatment, which alloy consists essentially of the following elements (in ppm where indicated, otherwise in wt %):

| | |
|---|---|
| C | .05–.09 |
| Si | .02 max. |
| Mn | .02 max. |
| P | .005 max. |
| S | 12 ppm max. |
| Cr | 5.5–7.0 |
| Co | 9.0–9.5 |
| Mo | .30–.70 |
| W | 8.0–9.0 |
| Ti | .5–.9 |
| Al | 5.5–6.0 |
| Ta | 3.0–4.0 |
| Hf | 1.2–1.8 |
| B | .010–.024 |
| Zr | .004–.010 |
| Fe | .15 max. |
| Cu | .01 max. |
| Cb | .10 max. |
| Mg | 80 ppm max. |
| V | .05 max. |
| Re | 2.8–3.1 |
| N | 10 ppm max. |
| O | 10 ppm max. |
| Ni | Balance |

16. An alloy having high temperature creep resistance for use in directionally solidified, columnar grain turbine blades which have a configuration such that they cannot be cast without excessive residual internal stresses, which result in airfoil recrystallization during high temperature solution treatment, said alloy containing from 0 to 0.2% by weight one or more of the elements selected from the group consisting of Y, La and Ce which alloy in addition thereto consists essentially of the following elements (in ppm where indicated, otherwise in wt %):

| | |
|---|---|
| C | .05–.09 |
| Si | .02 max. |

-continued

| | |
|---|---|
| Mn | .02 max. |
| P | .005 max. |
| S | 12 ppm max. |
| Cr | 5.5–7.0 |
| Co | 9.0–9.5 |
| Mo | .30–.70 |
| W | 8.0–9.0 |
| Ti | .5–.9 |
| Al | 5.5–6.0 |
| Ta | 3.0–4.0 |
| Hf | 1.2–1.8 |
| B | .010–.024 |
| Zr | .004–.010 |
| Fe | .15 max. |
| Cu | .01 max. |
| Cb | .10 max. |
| Mg | 80 ppm max. |
| V | .05 max. |
| Re | 2.8–3.1 |
| N | 10 ppm max. |
| O | 10 ppm max. |
| Ni | Balance |

17. An alloy having high temperature creep resistance and no grain boundary cracking during the DS casting operation, for use in directionally solidified, columnar grain, turbine vane castings which have a configuration such that they cannot be cast without generation of excessive internal stresses which would result in recrystallization during high temperature solution treatment, which alloy consists essentially of the following elements (in ppm where indicated, otherwise in wt %):

| | |
|---|---|
| C | .05–.09 |
| Si | .02 max. |
| Mn | .02 max. |
| P | .005 max. |
| S | 12 ppm max. |
| Cr | 5.5–7.0 |
| Co | 9.0–9.5 |
| Mo | .30–.70 |
| W | 8.0–9.0 |
| Ti | .5–.9 |
| Al | 5.5–6.0 |
| Ta | 3.0–4.0 |
| Hf | 1.2–1.8 |
| B | .012–.024 |
| Zr | .004–.010 |
| Fe | .15 max. |
| Cu | .01 max. |
| Cb | .10 max. |
| Mg | 80 ppm max. |
| V | .05 max. |
| Re | 2.8–3.1 |
| N | 10 ppm max. |
| O | 10 ppm max. |
| Ni | Balance |

18. A nickel based low carbon alloy capable of columnar grain directional solidification casting for use under high stress and high temperature, having without high temperature solution treatment, stress-rupture and creep-rupture mechanical properties approaching those of a nickel base single crystal alloy which have been subjected to high temperature solution treatment, which alloy consists essentially of the following elements (in ppm wherein indicated, otherwise in wt %):

| | |
|---|---|
| C | .05–.09 |
| Si | .02 max. |
| Mn | .02 max. |
| P | .005 max. |
| S | 12 ppm max. |
| Cr | 5.5–7.0 |
| Co | 9.0–9.5 |
| Mo | .30–.70 |
| W | 8.0–9.0 |
| Ti | .5–.9 |
| Al | 5:5–6.0 |
| Ta | 3.0–4.0 |
| Hf | 1.2–1.8 |
| B | .012–.024 |
| Zr | .004–.010 |
| Fe | .15 max. |
| Cu | .01 max. |
| Cb | .10 max. |
| Mg | 80 ppm max. |
| V | .05 max. |
| Re | 2.8–3.1 |
| N | 10 ppm max. |
| O | 10 ppm max. |
| Ni | Balance |

19. A nickel based low carbon alloy as described in claim 18 which is essentially free of excessive $M_6C$ or TCP phases after continuous exposure to 21.76 ksi at 1762° F. for a minimum of 2900 hours.

* * * * *

UNITED STATES PATENT AND TRADEMARK OFFICE
CERTIFICATE OF CORRECTION

PATENT NO. : 5,069,873
DATED : December 3, 1991
INVENTOR(S) : Kenneth Harris & Gary L. Erickson It is certified that error appears in the above-identified patent and that said Letters Patent is hereby corrected as shown below:

Column 7, line 43
    Cancel "35" and substitute --55--.
Column 7, line 45:
    Cancel "35".

IN THE DRAWINGS
    In each of Figs. 1, 2 and 3 (inclusive) please make the following changes:
    Printed vertically to the left of each of the Figs. add:
--Stress ksi--.
    Below each of the Figs. 1, 2 and 3, in the equation:
--$P=(T+460)[20 + \log 10^t]10^{-3}$--.
The expression "$\log 10^t$" should read --$\log_{10} t$--.
    Fig. 2:
After "P" delete "44".

Signed and Sealed this

Twelfth Day of July, 1994

Attest:

BRUCE LEHMAN

Attesting Officer      Commissioner of Patents and Trademarks